United States Patent
Azmat et al.

(10) Patent No.: US 11,461,521 B2
(45) Date of Patent: Oct. 4, 2022

(54) INTEGRATED CIRCUIT INCLUDING STANDARD CELL AND METHOD OF FABRICATING THE INTEGRATED CIRCUIT

(71) Applicant: Samsung Electronics Co., Ltd., Suwon-si (KR)

(72) Inventors: Raheel Azmat, Suwon-si (KR); Sidharth Rastogi, Hwaseong-si (KR); Chul-Hong Park, Seongnam-si (KR); Jae-Seok Yang, Hwaseong-si (KR); Kwan-Young Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 212 days.

(21) Appl. No.: 16/401,820

(22) Filed: May 2, 2019

(65) Prior Publication Data
US 2020/0057830 A1 Feb. 20, 2020

(30) Foreign Application Priority Data
Aug. 16, 2018 (KR) .................. 10-2018-0095734

(51) Int. Cl.
*G06F 30/327* (2020.01)
*H01L 27/02* (2006.01)
*G06F 30/398* (2020.01)

(52) U.S. Cl.
CPC .......... *G06F 30/327* (2020.01); *G06F 30/398* (2020.01); *H01L 27/0207* (2013.01)

(58) Field of Classification Search
CPC .............................. G06F 30/327; G06F 30/398
USPC ....................................................... 716/104
See application file for complete search history.

(56) References Cited

U.S. PATENT DOCUMENTS

| | | | |
|---|---|---|---|
| 5,824,570 A | * | 10/1998 | Aoki .................. H01L 27/0207 438/128 |
| 7,329,938 B2 | | 2/2008 | Kinoshita |
| 8,357,955 B2 | | 1/2013 | Tanaka |
| 8,698,205 B2 | | 4/2014 | Tzeng et al. |
| 9,007,095 B2 | | 4/2015 | Penzes |
| 9,558,312 B2 | | 1/2017 | Lu et al. |
| 9,929,087 B2 | | 3/2018 | Guo et al. |
| 10,177,166 B2 | | 1/2019 | Kang et al. |

(Continued)

FOREIGN PATENT DOCUMENTS

KR 1020170124027 A 11/2017

OTHER PUBLICATIONS

Office Action dated Aug. 22, 2022 by the Korean Intellectual Property Office for corresponding KR Patent Application No. 10-2018-0095734.

*Primary Examiner* — Suchin Parihar
(74) *Attorney, Agent, or Firm* — Muir Patent Law, PLLC

(57) ABSTRACT

An integrated circuit including a standard cell includes: a plurality of first wells extending in a first horizontal direction with a first width and of a first conductivity type; and a plurality of second wells extending in the first horizontal direction with a second width and having a second conductivity type, wherein the plurality of first wells and the plurality of second wells are alternately arranged in a second horizontal direction that is orthogonal to the first horizontal direction, and when m and n are integers greater than or equal to 3, the standard cell has a length in the second horizontal direction, the length being equal to a sum of m times a half of the first width and n times a half of the second width.

10 Claims, 18 Drawing Sheets

(56) References Cited

U.S. PATENT DOCUMENTS

| | | | |
|---|---|---|---|
| 10,909,298 B1* | 2/2021 | Chan | H01L 27/0207 |
| 2002/0040985 A1* | 4/2002 | Aldrich | H01L 27/11807 |
| | | | 257/202 |
| 2005/0044522 A1* | 2/2005 | Maeda | H01L 27/0207 |
| | | | 716/53 |
| 2006/0138464 A1* | 6/2006 | Shimamura | G06F 30/392 |
| | | | 257/204 |
| 2008/0142898 A1* | 6/2008 | Watanabe | H01L 21/82385 |
| | | | 257/369 |
| 2014/0217513 A1* | 8/2014 | Hayashi | H01L 27/0207 |
| | | | 257/369 |
| 2016/0117431 A1* | 4/2016 | Kim | H01L 27/11807 |
| | | | 716/119 |
| 2017/0062403 A1* | 3/2017 | Song | G06F 30/398 |
| 2017/0371995 A1 | 12/2017 | Correale, Jr. et al. | |
| 2018/0075182 A1 | 3/2018 | Zhuang et al. | |
| 2018/0183414 A1* | 6/2018 | Guo | H03K 3/02332 |
| 2020/0050728 A1* | 2/2020 | Kim | G06F 30/394 |
| 2020/0057830 A1* | 2/2020 | Azmat | G06F 30/327 |

\* cited by examiner

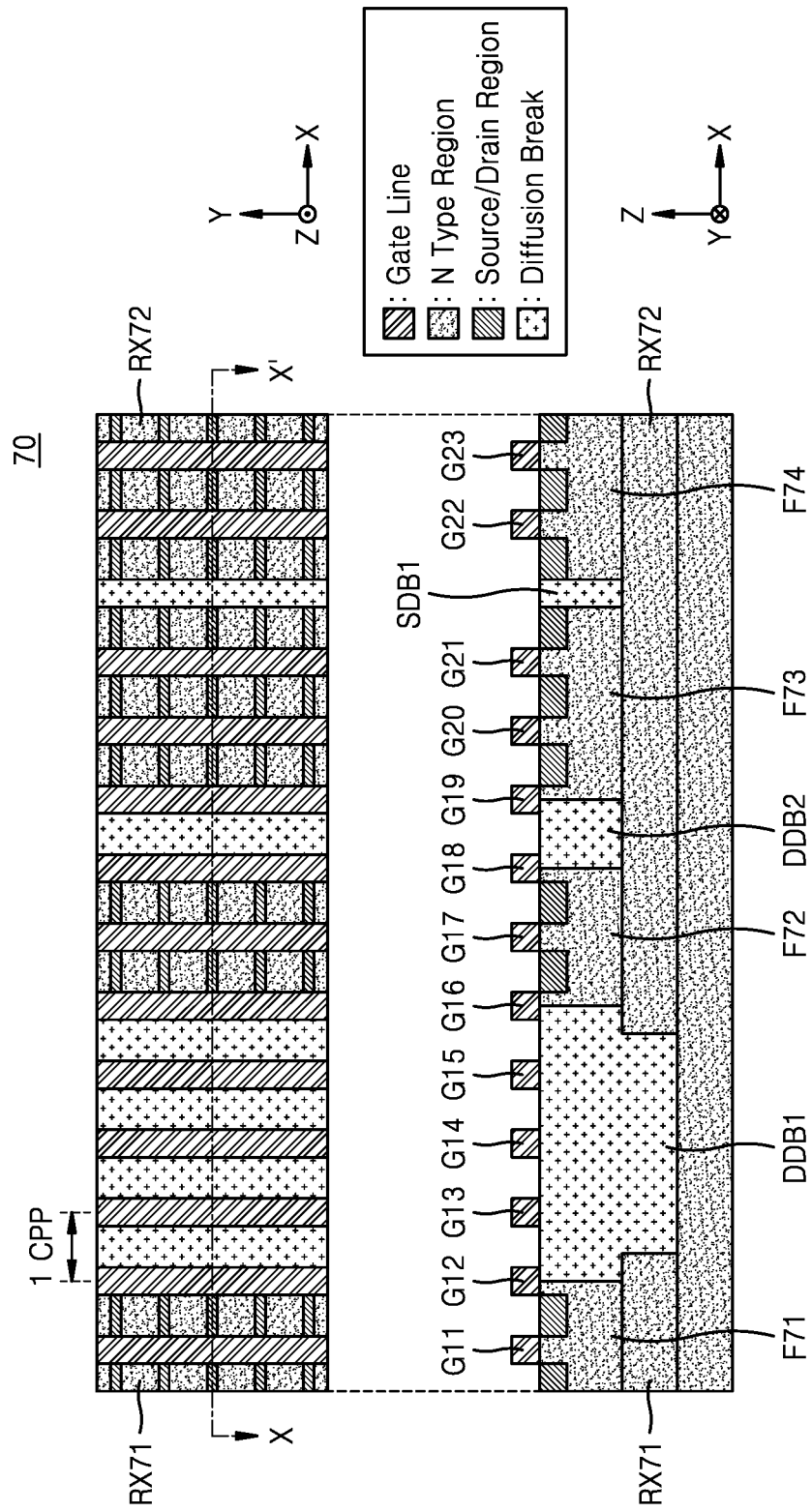

INTEGRATED CIRCUIT INCLUDING STANDARD CELL AND METHOD OF FABRICATING THE INTEGRATED CIRCUIT

CROSS-REFERENCE TO RELATED APPLICATION

This application claims the benefit of Korean Patent Application No. 10-2018-0095734, filed on Aug. 16, 2018, in the Korean Intellectual Property Office, the disclosure of which is incorporated herein in its entirety by reference.

BACKGROUND

The inventive concept relates to an integrated circuit, and more particularly, to an integrated circuit including a standard cell and a method of fabricating the integrated circuit.

An integrated circuit may include a plurality of standard cells. The integrated circuit may include standard cells that provide the same function and include standard cells that provide different functions. In addition, the integrated circuit may include standard cells that provide the same function and different characteristics and include, for example, standard cells selected based on, for example, an operating speed, power consumption, an area, and the like among a plurality of standard cells that perform the same function. According to the development of a semiconductor process, a standard cell having a reduced area may be provided, but to satisfy a desired requirement, for example, a desired operating speed, a wide-area standard cell that provides a high current driving capability may be required for an integrated circuit fabricated in a given semiconductor process.

SUMMARY

The inventive concept relates to an integrated circuit including a standard cell and provides a standard cell that provides a high current driving capability and an efficient structure, an integrated circuit including the same, and a method of fabricating the integrated circuit.

According to an aspect of the inventive concept, there is provided an integrated circuit including a standard cell, including: a plurality of first wells extending in a first horizontal direction, the plurality of first wells having a first width and a first conductivity type; and a plurality of second wells extending in the first horizontal direction, the plurality of second wells having a second width and a second conductivity type, wherein the plurality of first wells and the plurality of second wells are alternately arranged in a second horizontal direction that is orthogonal to the first horizontal direction, and wherein the standard cell has a length in the second horizontal direction, the length being equal to a sum of m times a half of the first width and n times a half of the second width, wherein m and n are integers greater than or equal to 3.

According to another aspect of the inventive concept, there is provided an integrated circuit including a standard cell, including: a plurality of first power lines extending in a first horizontal direction and to which a first supply voltage is applied; and a plurality of second power lines extending in the first horizontal direction and to which a second supply voltage is applied, wherein the plurality of first power lines and the plurality of second power lines are alternately arranged at equal intervals in a second horizontal direction that is orthogonal to the first horizontal direction, and the standard cell has a length in the second horizontal direction, the length being greater than or equal to three times a pitch between a first power line and a second power line adjacent to each other.

According to another aspect of the inventive concept, there is provided an integrated circuit including a standard cell including: at least two first active regions having a first conductivity type extending in a first horizontal direction; at least two second active regions having a second conductivity type extending in the first horizontal direction; and a first gate line extending in a second horizontal direction that is orthogonal to the first horizontal direction, the first gate line forming transistors on the at least two first active regions, wherein the at least two first active regions and the at least two second active regions are alternately arranged in the second horizontal direction.

BRIEF DESCRIPTION OF THE DRAWINGS

The drawings attached to the specification may be in a wrong scale and exaggerate or downscale components for convenience of the drawings.

Embodiments of the inventive concept will be more clearly understood from the following detailed description taken in conjunction with the accompanying drawings in which:

FIG. 7 illustrates a diffusion break according to an example embodiment of the inventive concept;

DETAILED DESCRIPTION OF THE EMBODIMENTS

Figure 1A:
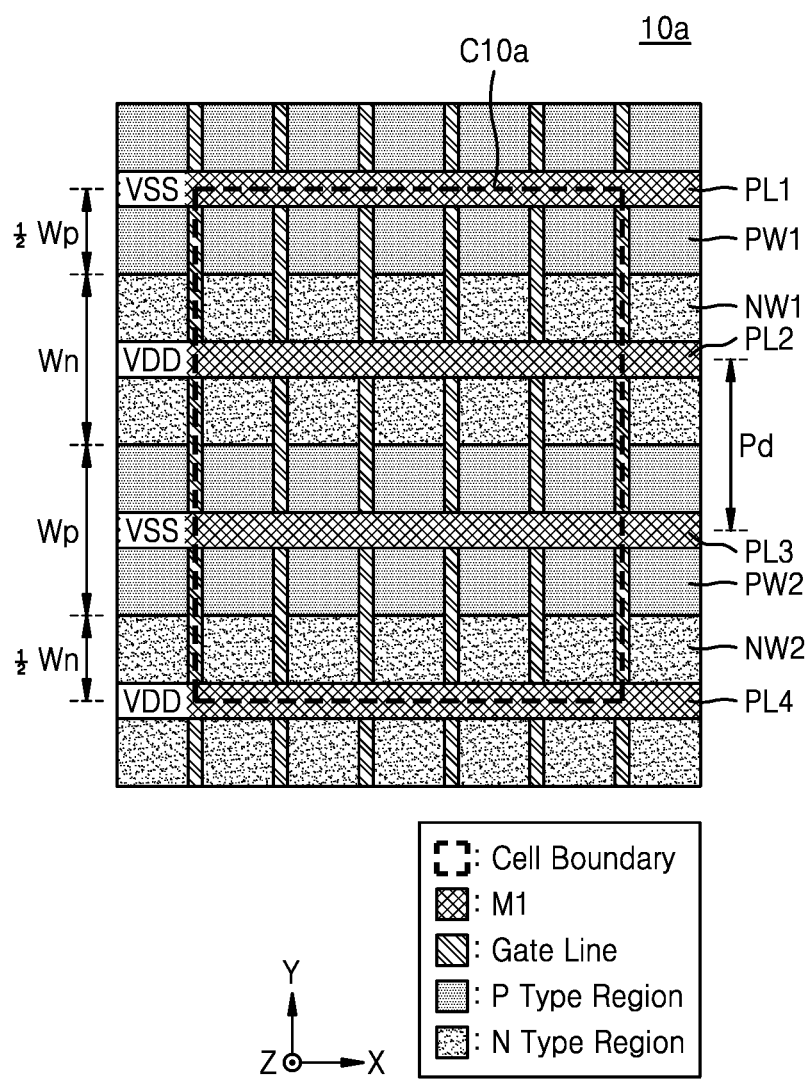
FIGS. 1A and 1B illustrate integrated circuits (ICs) according to example embodiments of the inventive concept.
Figure 1B:
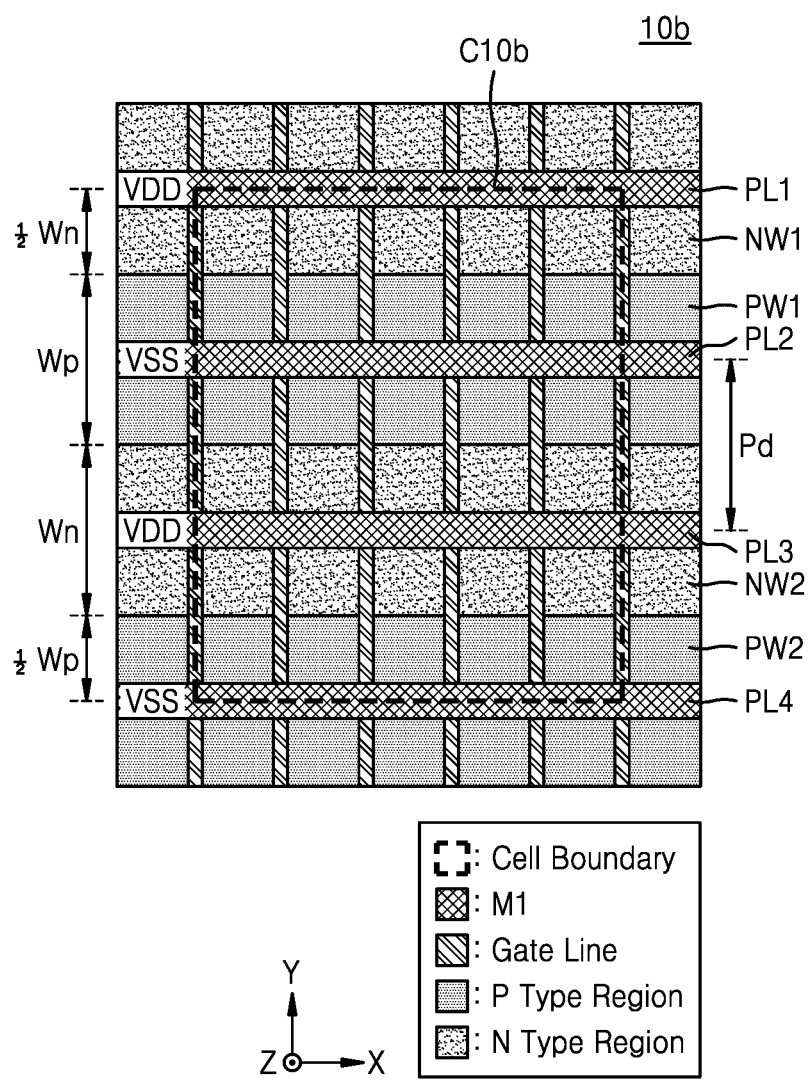

FIGS. 1A and 1B illustrate integrated circuits (ICs) according to example embodiments of the inventive concept. Particularly, FIGS. 1A and 1B are top views of partial layouts of ICs 10a and 10b respectively including standard cells C10a and C10b, which are shown on a plane made by an X axis and a Y axis. Hereinafter, repeated description given with reference to FIGS. 1A and 1B will not be provided In the specification, an X-axis direction and a Y-axis direction may be respectively referred to as a first horizontal direction and a second horizontal direction, a Z-axis direction may be referred to as a vertical direction. The plane made by the X axis and the Y axis may be referred to as a horizontal plane, it may be understood that a component arranged relatively in a +Z direction with respect to another component is located above the same, and it may be understood that a component arranged relatively in a −Z direction with respect to another component is located under the same. In addition, an area of a component may indicate a size taken by the component on a surface parallel to the horizontal plane. In the drawings of the specification, only partial layers may be shown for convenience of the drawings, and to indicate a connection between a pattern of a metal layer (for example, an M1 layer) and a lower conductive pattern, even though a via is located under the pattern of the metal layer, the via may be shown on the pattern of the metal layer.

A standard cell is a unit of layout included in an IC and may be simply referred to as a cell. The IC may include various multiple standard cells, and the standard cells may have a structure conforming to rules pre-defined based on a semiconductor process for fabricating an IC. For example, as shown in FIG. 1A, the IC 10a may include a plurality of N-wells (e.g., NW1) extending in the X-axis direction with a width "Wn" and a plurality of P-wells (e.g., PW2) extending in the X-axis direction with a width "Wp", and the plurality of N-wells and the plurality of P-wells may be alternately arranged to be mutually adjacent in the Y-axis direction. The plurality of N-wells and the plurality of P-wells may come in contact with each other in the Y-axis direction. According to some embodiments, the width "Wn" of the N-well may coincide with the width "Wp" of the P-well. According to some embodiments, a well may be formed in a substrate, and the substrate may include a semiconductor such as silicon (Si) or germanium (Ge) or a compound semiconductor such as SiGe, silicon carbide (SiC), gallium arsenide (GaAs), indium arsenide (InAs), or indium phosphide (InP) and include a conductive region, for example, an impurity-doped well or an impurity-doped structure.

The IC 10a may include power lines (e.g., second and fourth power lines PL2 and PL4) extending in the X-axis direction and configured to apply a positive supply voltage VDD thereto and power lines (e.g., first and third power lines PL1 and PL3) extending in the X-axis direction and configured to apply a negative supply voltage VSS (or a ground voltage) thereto, and the power lines to which the positive supply voltage VDD is applied and the power lines to which the negative supply voltage VSS is applied may be alternately arranged in the Y-axis direction by being spaced apart by a constant pitch, i.e., "Pd" (Pd=(Wn+Wp)/2). The standard cell C10a may receive supply voltages from the first to fourth power lines PL1 to PL4.

The IC 10a may include a plurality of gate lines extending in the Y-axis direction. The standard cell C10a may further include a transistor and additional patterns for routing according to a desired function, based on a structure of the IC 10a. Although FIG. 1A shows a plurality of gate lines continuously extending in the Y-axis direction for convenience of the drawings, the standard cell C10a may include gate lines separated in the Y-axis direction by, for example, an etching process, and this may be commonly adapted to layouts of a standard cell illustrated in the present specification. In addition, although four gate lines included in the standard cell C10a are illustrated, it will be understood that a standard cell may include more or less than four gate lines. According to some embodiments, a gate line may include a work function metal-containing layer and a gap-fill metal layer. For example, the work function metal-containing layer may include at least one among titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), and palladium (Pd), and the gap-fill metal layer may include a W layer or an Al layer. According to some embodiments, the gate lines may include a stacked structure of titanium aluminum carbide (TiAlC)/titanium nitride (TiN)/W, a stacked structure of TiN/tantalum nitride (TaN)/TiAlC/TiN/W, or a stacked structure of TiN/TaN/TiN/TiAlC/TiN/W. In the drawings, a fin extending in the X-axis direction may not be shown for convenience of the drawings, but it will be understood that the example embodiments of the inventive concept are applicable to not only cells including a planar transistor but also cells including a fin-shaped field effect transistor (FinFET).

According to some embodiments, when each of variable m and variable n is an integer greater than or equal to 3, a standard cell may have a height "H" satisfying Equation 1 below, i.e., a length in the Y-axis direction.

$$H = m \cdot \tfrac{1}{2} Wn + n \cdot \tfrac{1}{2} Wp \quad (m \geq 3, n \geq 3) \tag{1}$$

For example, the standard cell C10a in FIG. 1A may have a height corresponding to "3/2 Wn+3/2 Wp" (m=3, n=3) and may have a minimum height according to Equation 1. Alternatively, according to some embodiments, a standard cell may have a height of three times or more the pitch "Pd" between power lines, and the standard cell C10a in FIG. 1A may have a height corresponding to "3Pd". Therefore, the standard cell C10a may fully cross at least one N-well (e.g., NW1) and at least one P-well (e.g., PW2). In addition, the standard cell C10a may at least partially cross two or more wells of the same conductivity type (e.g., NW1 and NW2 or PW1 and PW2). Therefore, the standard cell C10a may include a transistor having a wide channel width, and for example, as described below with reference to FIGS. 4 and 5, the number of fins (or active fins) used to form a transistor in the standard cell C10a may increase. The standard cell C10a may provide a high current driving capability and a high operating speed, and as a result, the IC 10a may have improved performance.

The standard cell C10a may receive the negative supply voltage VSS from the first power line PL1 and the third power line PL3 and receive the positive supply voltage VDD from the second power line PL2 and the fourth power line PL4. As shown in FIG. 1A, the first power line PL1 and the fourth power line PL4 may extend on a boundary of the standard cell C10a, the first power line PL1 may be shared by the standard cell C10a and a standard cell adjacent to the standard cell C10a in a +Y direction, and the fourth power line PL4 may be shared by the standard cell C10a and a standard cell adjacent to the standard cell C10a in a −Y direction.

According to some embodiments, power lines may extend in the X-axis direction on wells, for example, may extend in the X-axis direction on center lines of the wells, which extend in the X-axis direction. In the present specification, a center line of a component may indicate a virtual line extending in a direction where the component extends, along the center of the component. As shown in FIG. 1A, the first to fourth power lines PL1 to PL4 may extend in the X-axis direction on the four wells PW1, NW1, PW2, and NW2, respectively. Therefore, patterns that unnecessarily extend in the X-axis direction and/or the Y-axis direction to be connected to the first to fourth power lines PL1 to PL4 may be removed, and the standard cell C10a may have a simple routing structure. Due to the simple routing structure of the standard cell C10a, routing congestion of the IC 10a may be solved and the operating reliability of the IC 10a may be improved.

Referring to FIG. 1B, the standard cell C10b in FIG. 1B may provide the same function and performance as the standard cell C10a in FIG. 1A, have the same height, i.e., a length in the Y-axis direction corresponding to "3/2 Wn+3/2 Wp" as the standard cell C10a in FIG. 1A, and have a different structure from that of the standard cell C10a in FIG. 1A. For example, the standard cell C10b in FIG. 1B may have a symmetrical structure to the standard cell C10a in FIG. 1A based on an axis parallel to the X axis. As described below with reference to FIG. 10, in a process of fabricating an IC, standard cells that provide the same function and have different structures may be provided by a standard cell library (e.g., D102 in FIG. 10), and in a process of placing standard cells, a standard cell of an appropriate structure may be selected. For example, according to supply voltages applied to power lines and conductivity types of wells in a space in which a standard cell is arranged, one of the standard cell C10a in FIG. 1A and the standard cell C10b in FIG. 1B may be selected and arranged. Therefore, an IC may include standard cells that provide the same function and performance and respectively have different structures.

Figure 2A:
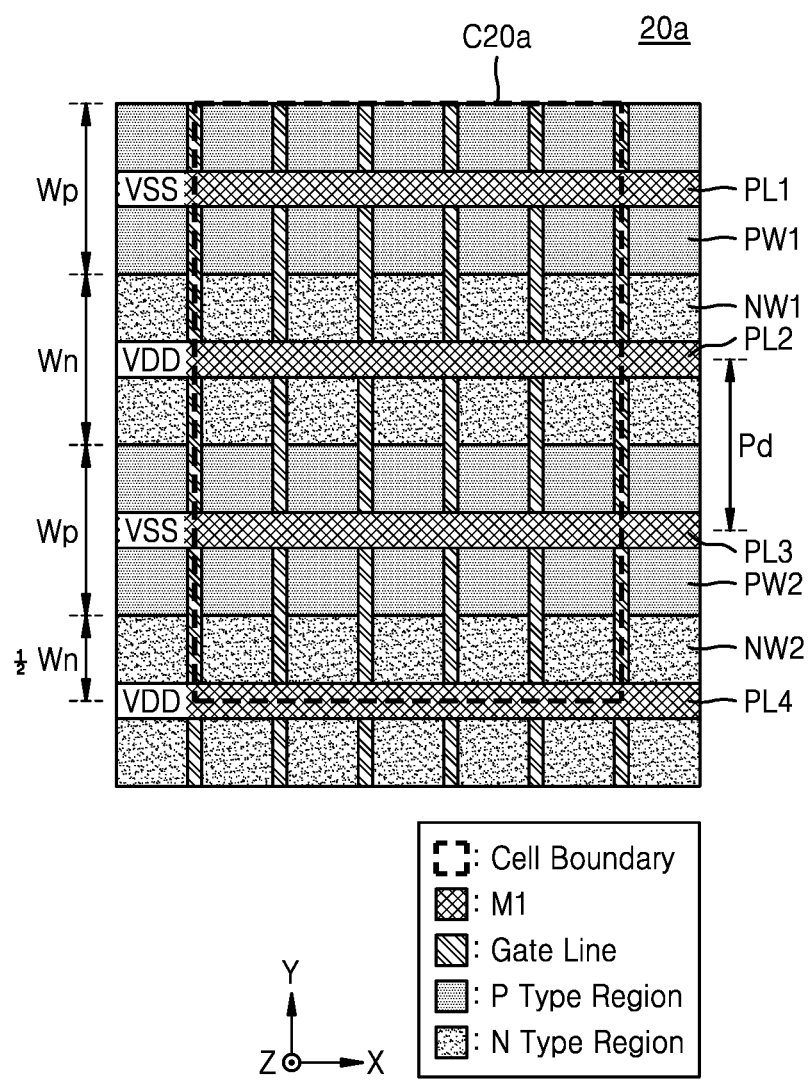
FIGS. 2A to 2D illustrate ICs according to example embodiments of the inventive concept.

FIGS. 2A to 2D illustrate ICs according to example embodiments of the inventive concept. Particularly, FIGS. 2A to 2D are top views showing layouts of ICs 20a, 20b, 20c, and 20d including standard cells C20a, C20b, C20c, and C20d, respectively. Hereinafter, description to be repeated with reference to FIGS. 2A to 2D and description given with reference to FIGS. 1A and 1B will not be provided According to some embodiments, a standard cell may have a boundary overlapping a boundary of a well or a center line of the well. For example, as shown in FIG. 2A, one of one pair of boundaries parallel to the X-axis direction (or facing in the Y-axis direction) in the standard cell C20a may overlap a boundary of a P-well PW1, and the other one thereof may overlap a center line of an N-well NW2 (or a center line of the fourth power line PL4). The standard cell C20a may have a height corresponding to "3/2 Wn+2 Wp", and referring to Equation 1, the variable m and the variable n in the standard cell C20a may be 3 and 4, respectively. Therefore, the standard cell C20a may include a transistor formed by P-wells PW1 and PW2 and a gate line, i.e., an N-channel FET (NFET), having a greater current driving capability than a transistor formed by N-wells NW1 and NW2 and a gate line, i.e., a P-channel FET (PFET). For example, when boosting of NFETs connected in series is necessary as in a NAND gate, a standard cell may non-uniformly include N-wells and P-wells as in the standard cell C20a in FIG. 2A.

Figure 2B:
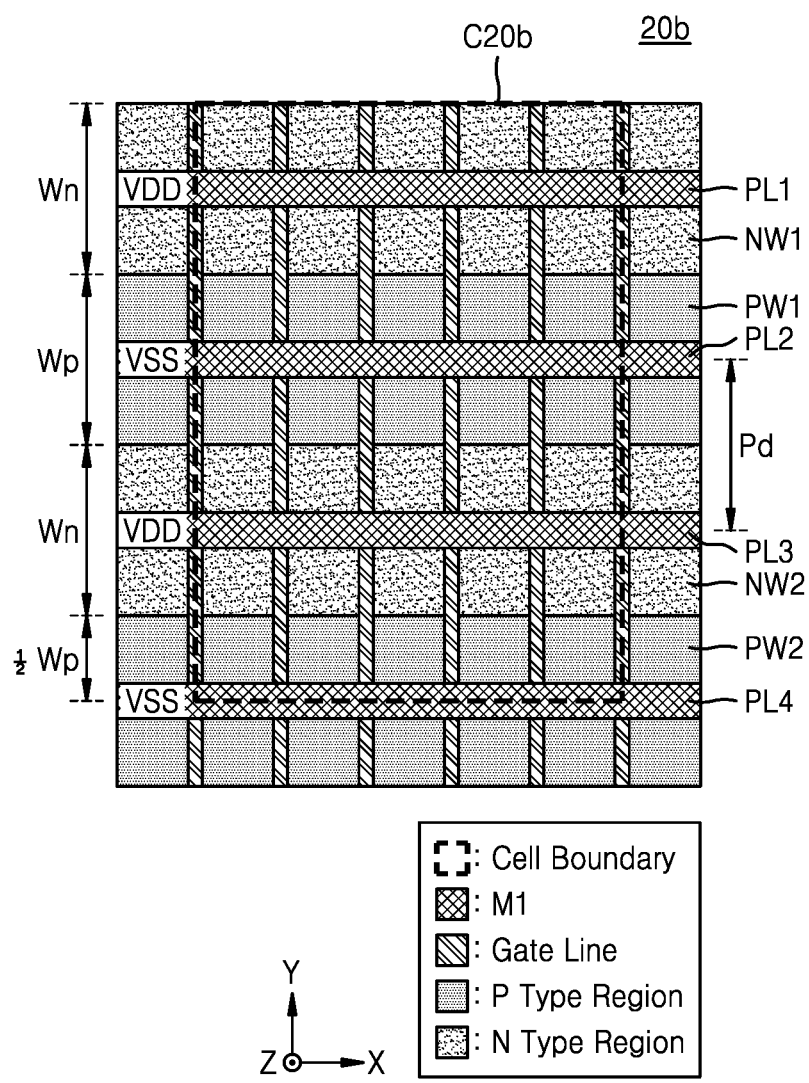

Referring to FIG. 2B, one of one pair of boundaries parallel to the X-axis direction in the standard cell C20b may overlap a boundary of an N-well NW1, and the other one thereof may overlap a center line of a P-well PW2 (or a center line of the fourth power line PL4). The standard cell C20b may have a height corresponding to "2 Wn+3/2 Wp", and referring to Equation 1, the variable m and the variable n in the standard cell C20b may be 4 and 3, respectively. Therefore, the standard cell C20b may include a transistor formed by N-wells NW1 and NW2 and a gate line, i.e., a PFET, having a greater current driving capability than a transistor formed by P-wells PW1 and PW2 and a gate line, i.e., an NFET.

Figure 2C:
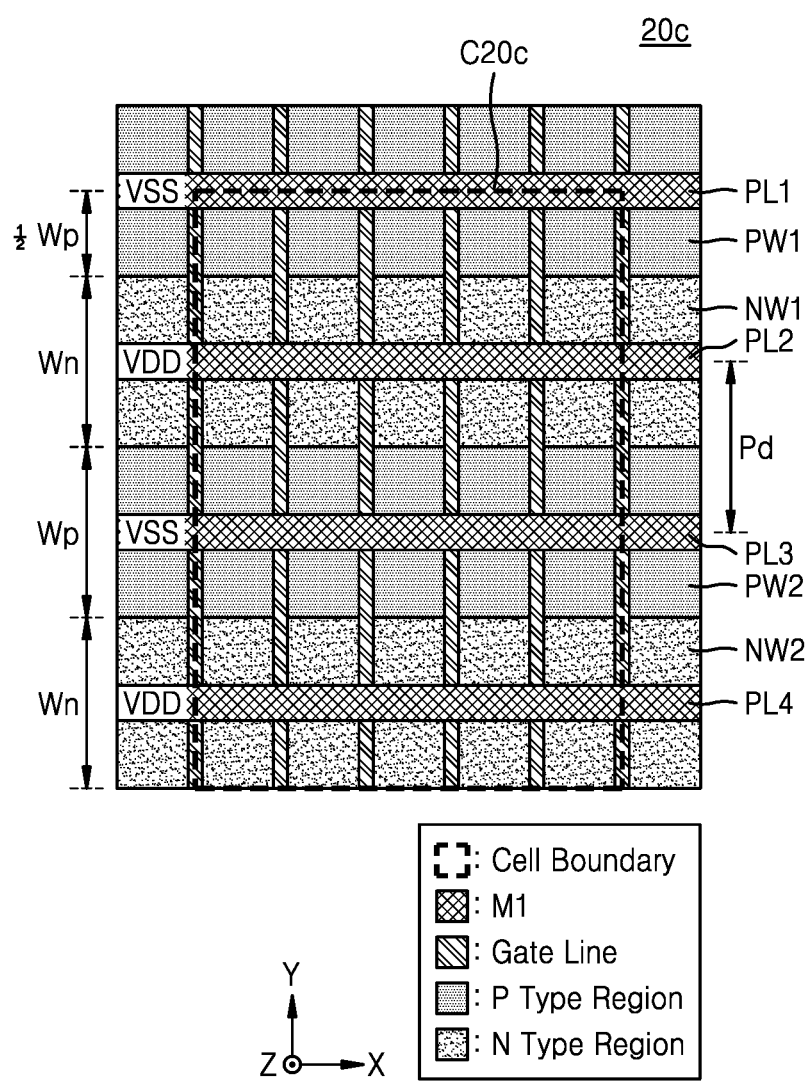

Referring to FIG. 2C, one of one pair of boundaries parallel to the X-axis direction in the standard cell C20c may overlap a center line of the P-well PW1 (or a center line of the first power line PL1), and the other one thereof may overlap a boundary of the N-well NW2. The standard cell C20c may have a height corresponding to "2 Wn+3/2 Wp", and referring to Equation 1, the variable m and the variable n in the standard cell C20c may be 4 and 3, respectively. According to some embodiments, the standard cell C20c may provide the same function and performance as the standard cell C20b in FIG. 2B and have a structure symmetrical to a structure of the standard cell C20b in FIG. 2B based on an axis parallel to the X axis. Therefore, as described above with reference to FIGS. 1A and 1B, in a process of arranging a standard cell, one of the standard cell C20b in FIG. 2B and the standard cell C20c in FIG. 2C may be selected and arranged.

Figure 2D:
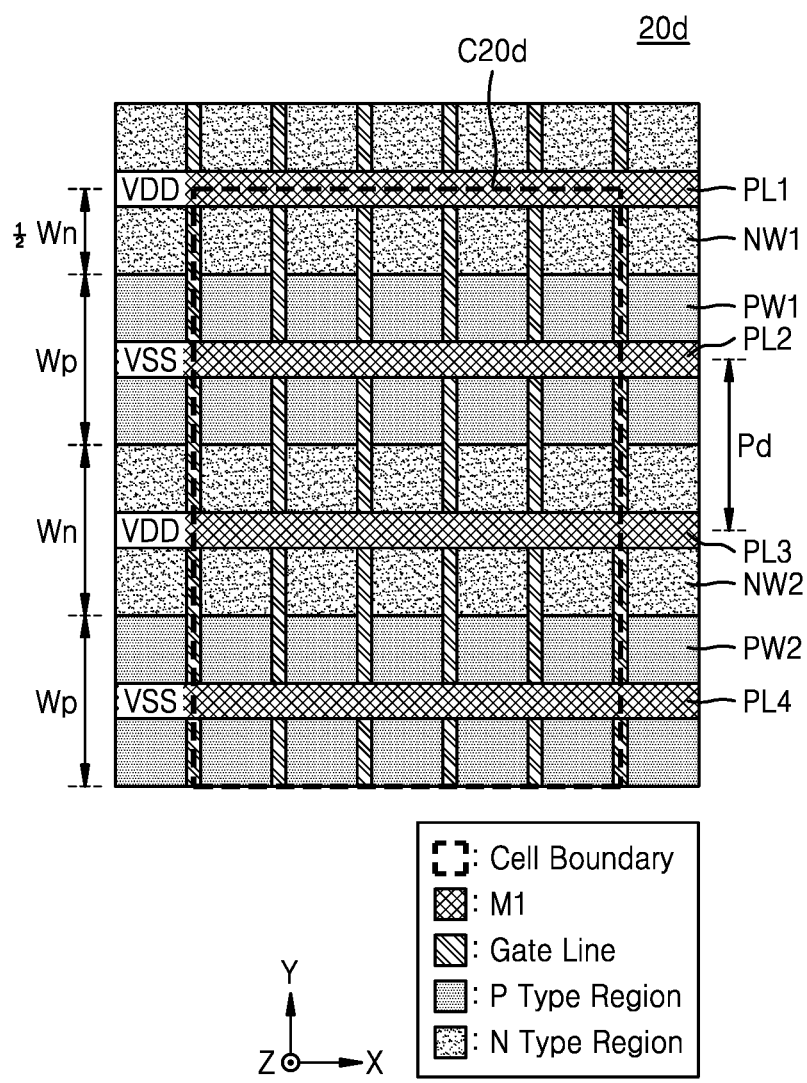

Referring to FIG. 2D, one of one pair of boundaries parallel to the X-axis direction in the standard cell C20d may overlap a center line of the N-well NW1 (or a center line of the first power line PL1), and the other one thereof may overlap a boundary of the P-well PW2. The standard cell C20d may have a height corresponding to "3/2 Wn+2 Wp", and referring to Equation 1, the variable m and the variable n in the standard cell C20d may be 3 and 4, respectively. According to some embodiments, the standard cell C20d may provide the same function and performance as the standard cell C20a in FIG. 2A and have a structure symmetrical to a structure of the standard cell C20a in FIG. 2A based on an axis parallel to the X axis. Therefore, in a process of arranging a standard cell, one of the standard cell C20a in FIG. 2A and the standard cell C20d in FIG. 2D may be selected and arranged.

Figure 3A:
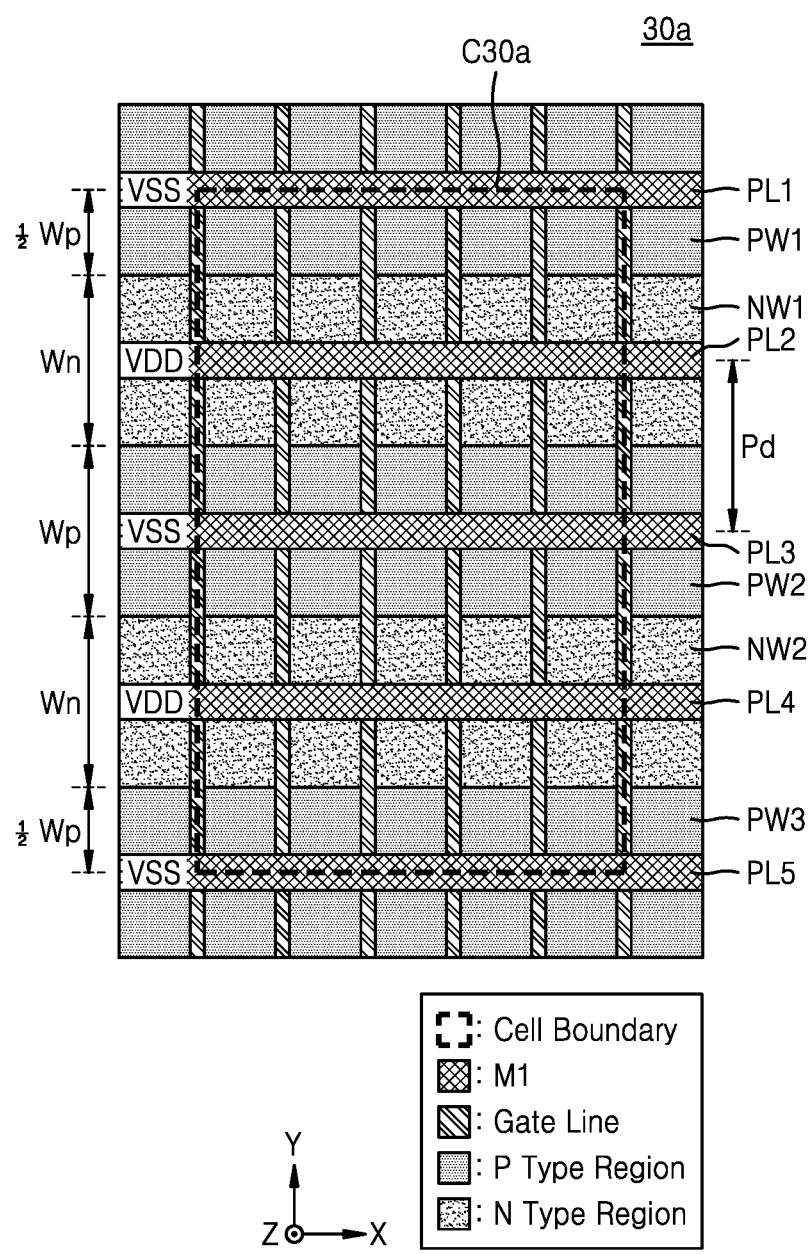
FIGS. 3A and 3B illustrate ICs according to example embodiments of the inventive concept.
Figure 3B:
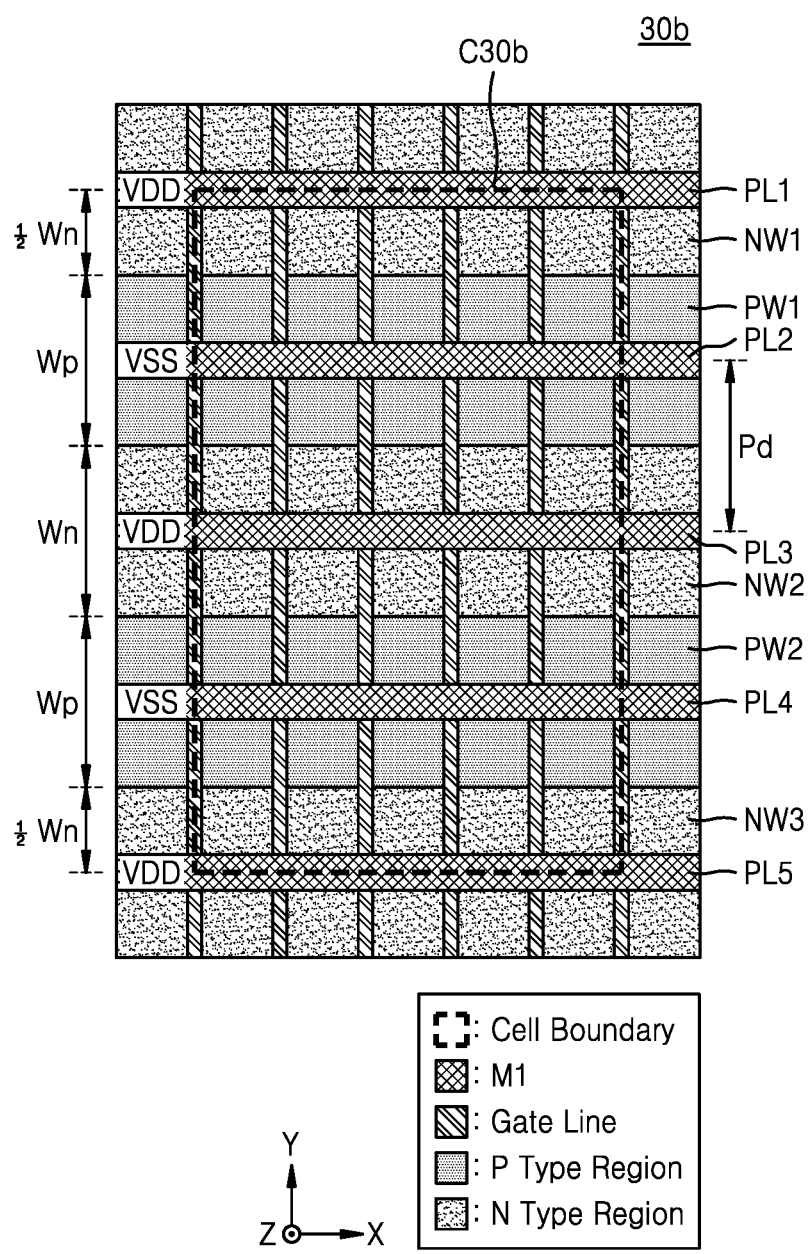

FIGS. 3A and 3B illustrate ICs according to example embodiments of the inventive concept. Particularly, FIGS. 3A and 3B are top views showing layouts of ICs 30a and 30b including standard cells C30a and C30b, respectively. Hereinafter, duplicated contents in the description with reference to FIGS. 3A and 3B and contents duplicated with the description with reference to FIGS. 1A and 1B will not be repeated.

According to some embodiments, a standard cell may fully cross three or more wells continuously arranged in the Y-axis direction. For example, as shown in FIG. 3A, the standard cell C30a may fully cross two N-wells NW1 and NW2 and one P-well PW2. The fifth power line PL5 may extend in the X-axis direction on the P-well PW3. Therefore, the standard cell C30a may have a height corresponding to "2 Wn+2 Wp", and referring to Equation 1, both the variable m and the variable n in the standard cell C30a may be 4. Therefore, the standard cell C30a may uniformly include N-wells and P-wells and may have a larger area and provide a higher current driving capability than the standard cells C10a and C10b in FIGS. 1A and 1B.

Referring to FIG. 3B, the standard cell C30b may fully cross two P-wells PW1 and PW2 and one N-well NW2. Therefore, the standard cell C30b may have the same height corresponding to "2 Wn+2 Wp" as the standard cell C30a in FIG. 3A, and referring to Equation 1, both the variable m and the variable n in the standard cell C30b may be 4. Therefore, the standard cell C30b may uniformly include N-wells and P-wells. According to some embodiments, the standard cell C30b may provide the same function and performance as the standard cell C30a in FIG. 3A, and in a process of arranging a standard cell, one of the standard cell C30a in FIG. 3A and the standard cell C30b in FIG. 3B may be selected and arranged.

Figure 4:
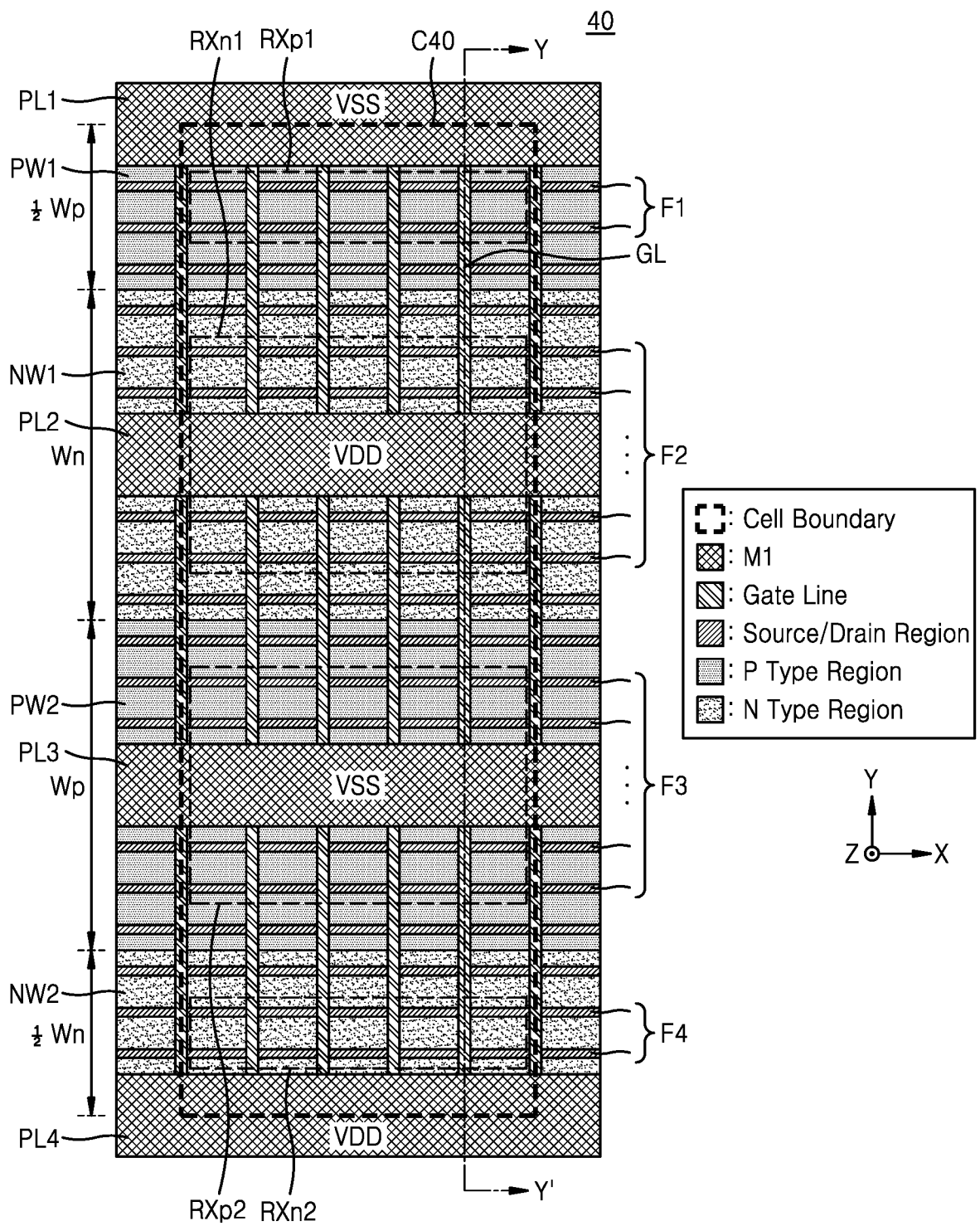
FIGS. 4 and 5 illustrate ICs according to example embodiments of the inventive concept.
Figure 5:
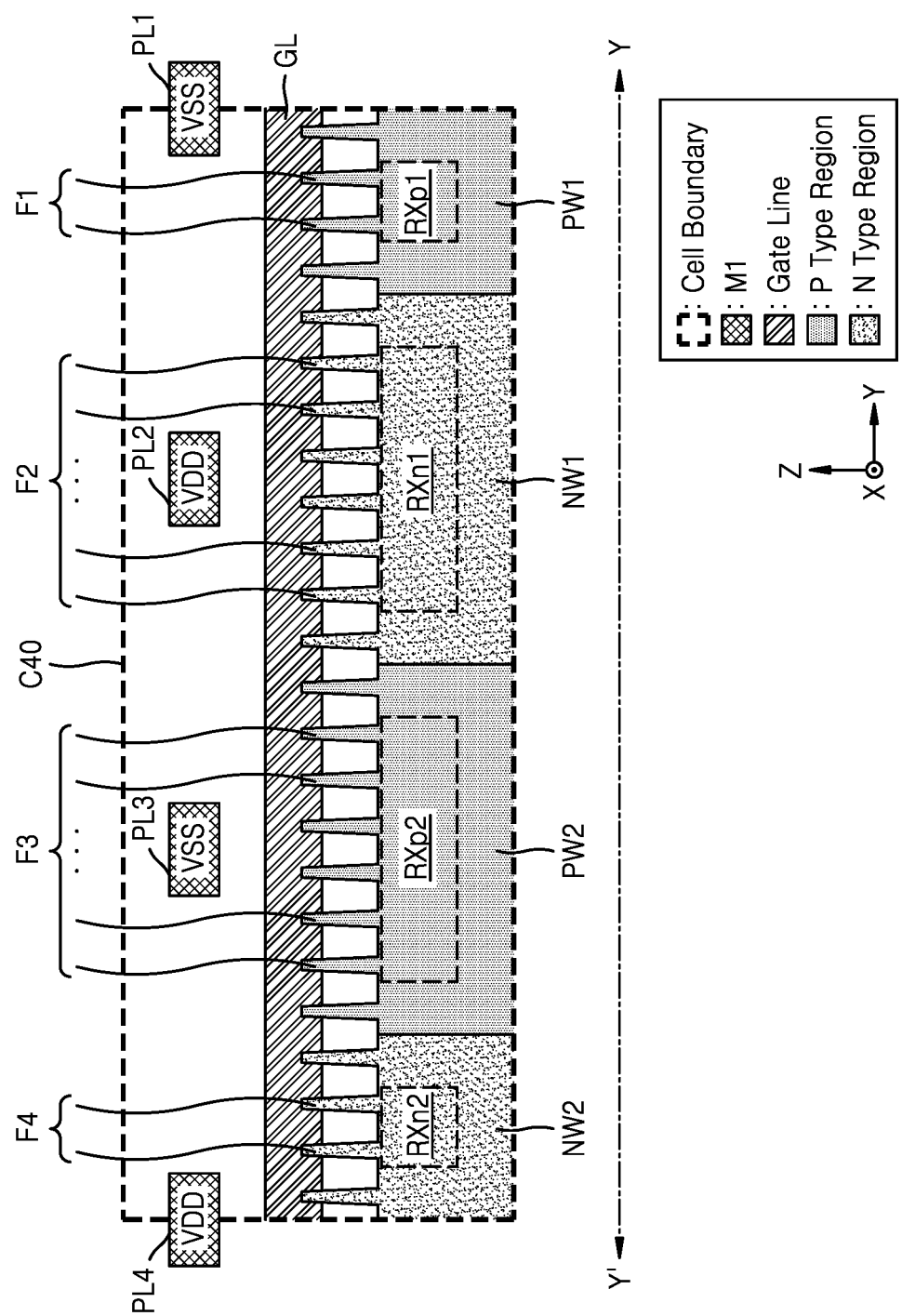

FIGS. 4 and 5 illustrate ICs according to example embodiments of the inventive concept. Particularly, FIG. 4 is a top view showing a layout of an IC 40 including a standard cell C40, and FIG. 5 is a cross-sectional view showing a cross-section of the IC 40 taken along line Y-Y' in FIG. 4.

The IC 40 may include a plurality of fins extending in the X-axis direction on wells. For example, fins including first active fins F1 on the P-well PW1 may extend in the X-axis direction, fins including second active fins F2 on the N-well NW1 may extend in the X-axis direction, fins including third active fins F3 on the P-well PW2 may extend in the X-axis direction, and fins including fourth active fins F4 on the N-well NW2 may extend in the X-axis direction. A gate insulating layer may be formed between a gate line and a fin. According to some embodiments, the gate insulating layer may include a silicon oxide layer, a high dielectric layer, or a combination thereof. According to some embodiments, an interface layer may be between the fin and the gate insulating layer, and the interface layer may include an insulating material, for example, an oxide layer, a nitride layer, or an oxynitride layer. A source/drain region may be formed at both sides of the gate line on the fin. According to some embodiments, the source/drain region may include an impurity ion injection region formed in a portion of the fin, a semiconductor epitaxial layer epitaxial-grown from a recess region formed in the fin, or a combination thereof.

The standard cell C40 may include a region in a well on which a transistor is formed, i.e., an active region, and fins extending onto the active region may form a transistor with a gate line GL. For example, the standard cell C40 may include a first p-type active region RXp1 extending in the X-axis direction as a portion of the P-well PW1, and the first active fins F1 extending in the X-axis direction on the first p-type active region RXp1 may form an NFET with the gate line GL. In addition, the standard cell C40 may include a first n-type active region RXn1 extending in the X-axis direction as a portion of the N-well NW1, and the second active fins F2 extending in the X-axis direction on the first n-type active region RXn1 may form a PFET with the gate line GL. Similarly, the third active fins F3 may extend in the X-axis direction on a second p-type active region RXp2 of the P-well PW2, and the fourth active fins F4 may extend in the X-axis direction on a second n-type active region RXn2 of the N-well NW2. According to some embodiments, it may be defined that the active region includes a lower part of the fins.

Fins which do not exist on the active region, i.e., fins other than the first to fourth active fins F1, F2, F3, and F4, may not form a transistor and may be referred to as dummy fins. Although the dummy fins maintain a structure similar to that of active fins in FIGS. 4 and 5, according to some embodiments, differently from FIGS. 4 and 5, at least a portion of the dummy fins may be removed (for example, through an etching process). In addition, according to some embodiments, a trench may be formed between active regions adjacent to each other in the Y-axis direction, and thus, at least a portion of wells adjacent to each other in the Y-axis direction may be removed.

Although not shown in FIG. 4 due to the second power line PL2 and the third power line PL3, as shown in FIG. 5, the second active fins F2 may include two active fins arranged under the second power line PL2, and the third active fins F3 may include two active fins arranged under the third power line PL3. Therefore, an NFET formed by one gate line (e.g., GL) in the standard cell C40 may be formed by a maximum of eight fins including the first active fins F1 and the third active fins F3 extending in the X-axis direction on the first p-type active region RXp1 and the second p-type active region RXp2. Similarly, a PFET formed by one gate line (e.g., GL) in the standard cell C40 may be formed by a maximum of eight fins including the second active fins F2 and the fourth active fins F4 extending in the X-axis direction on the first n-type active region RXn1 and the second n-type active region RXn2. In the drawings below, for convenience of the drawings, only an active region of a well may be shown and fins extending in the X-axis direction may not be shown.

Figure 6:
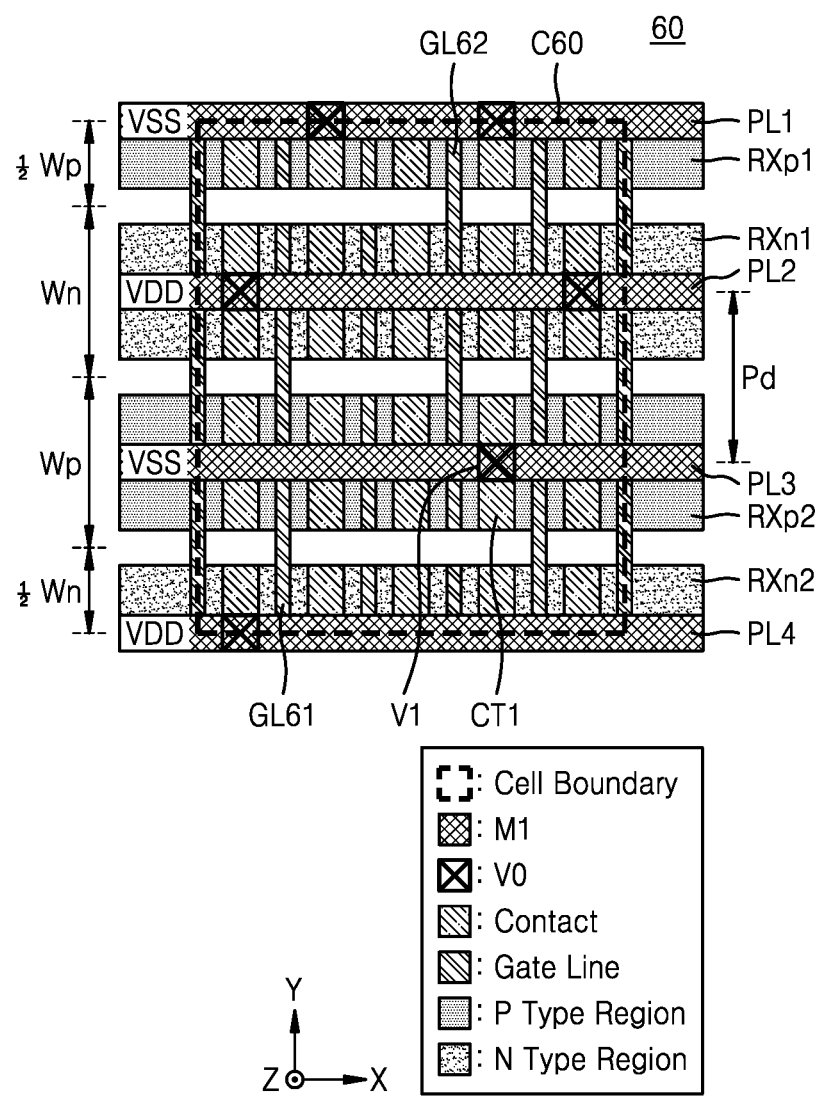
FIG. 6 illustrates an IC according to an example embodiment of the inventive concept.

FIG. 6 illustrates an IC according to an example embodiment of the inventive concept. Particularly, FIG. 6 is a top view showing a layout of an IC 60 including a standard cell C60.

In the IC 60, the first and second p-type active regions RXp1 and RXp2 and the first and second n-type active regions RXn1 and RXn2 may extend in the X-axis direction, and a plurality of gate lines (e.g., first and second gate lines GL61 and GL62 and the like) may extend in the Y-axis direction on the active regions. In addition, in the IC 60, the first to fourth power lines PL1, PL2, PL3, and PL4 may extend in the X-axis direction. Similarly to the standard cell C10a, the standard cell C60 may have a height corresponding to "3/2 Wn+3/2 Wp", receive the negative supply voltage VSS from the first and third power lines PL1 and PL3, and receive the positive supply voltage VDD from the second and fourth power lines PL2 and PL4.

According to some embodiments, a standard cell may include active regions (or fins formed on the active regions) of the same conductivity type and spaced apart in the Y-axis direction and a gate line forming transistors. For example, the first gate line GL61 may form PFETs on the first and second n-type active regions RXn1 and RXn2, respectively. According to some embodiments, the PFETs formed by the first gate line GL61 may have source/drain regions electrically connected to each other and may correspond to one PFET having a relatively high driving current and operating speed in a circuit diagram corresponding to the standard cell C60.

According to some embodiments, a source/drain region of a transistor may be connected to a power line through a contact and a via arranged on an active region. For example, as shown in FIG. 6, a source/drain region (or a source region) of an NFET formed by the second gate line GL62 on the second p-type active region RXp2 may be electrically connected to the third power line PL3 through a first contact CT1 and a first via VI and receive the negative supply voltage VSS therethrough. Therefore, patterns extending in the X-axis direction or the Y-axis direction on the second p-type active region RXp2 may be omitted, and the standard cell C60 may have a simple routing structure.

FIG. 7 illustrates a diffusion break (DB) according to an example embodiment of the inventive concept. Particularly, an upper portion of FIG. 7 is a top view showing a layout of an IC 70 including a DB, and a lower portion of FIG. 7 is a cross-sectional view showing a cross-section taken along line X-X' in the upper portion of FIG. 7.

According to some embodiments, a fin and/or an active region of a standard cell may be terminated by a DB. The DB may be inserted to reduce an influence, e.g., a local layout effect (LLE), between cells adjacent to each other, separate impurity-doped regions in between the cells adjacent to each other, and be filled with an insulator. The DB may separate only fins in between cells adjacent to each other according to some embodiments or separate active regions and/or wells in between the cells adjacent to each other according to some other embodiments.

Referring to FIG. 7, first and second active regions RX71 and RX72 may extend in the X-axis direction, and a plurality of gate lines G11 to G23 on the first and second active regions RX71 and RX72 may extend in parallel to each other in the Y-axis direction. A pitch between the plurality of gate lines G11 to G23 may be referred to as one contacted poly pitch (CPP).

A double diffusion break (DDB) may have a length of around one CPP or more in the X-axis direction. For example, the first active region RX71 and the second active region RX72 may be separated by a first DDB DDB1, and a first fin F71 and a second fin F72 may also be separated by the first DDB DDB1. In addition, the second fin F72 and a third fin F73 may be separated by a second DDB DDB2. A gate line on a DDB may be referred to as a dummy gate line, may not form an active region and a transistor, and may be used as a conductive path in some embodiments. For example, the gate lines G12 to G16 on the first DDB DDB1 are dummy gate lines and may not form a transistor, and the gate lines G18 and G19 on the second DDB DDB2 are also dummy gate lines and may not form a transistor. According to some embodiments, unlike FIG. 7, a DDB or a single diffusion break (SDB) may separate N-type regions, i.e., N-wells, from each other.

An SDB may have approximately the same length in the X-axis direction as a width of a gate line. For example, the third fin F73 and a fourth fin F74 may be separated by a first SDB SDB1, and no gate line may be formed on an SDB. According to some embodiments, unlike FIG. 7, an SDB may separate active regions. Hereinafter, example embodiments of the inventive concept will be described by mainly referring to the second DDB DDB2 and the first SDB SDB1.

Figure 8A:
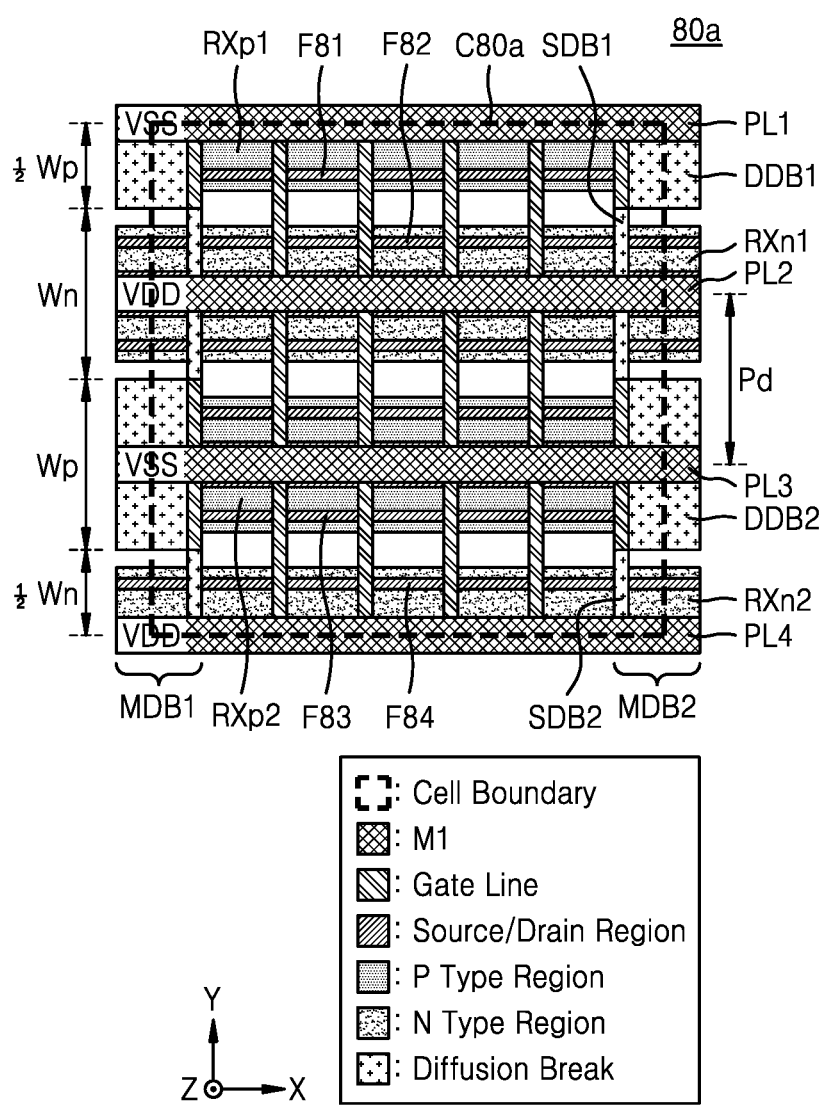
FIGS. 8A and 8B illustrate ICs according to example embodiments of the inventive concept.
Figure 8B:
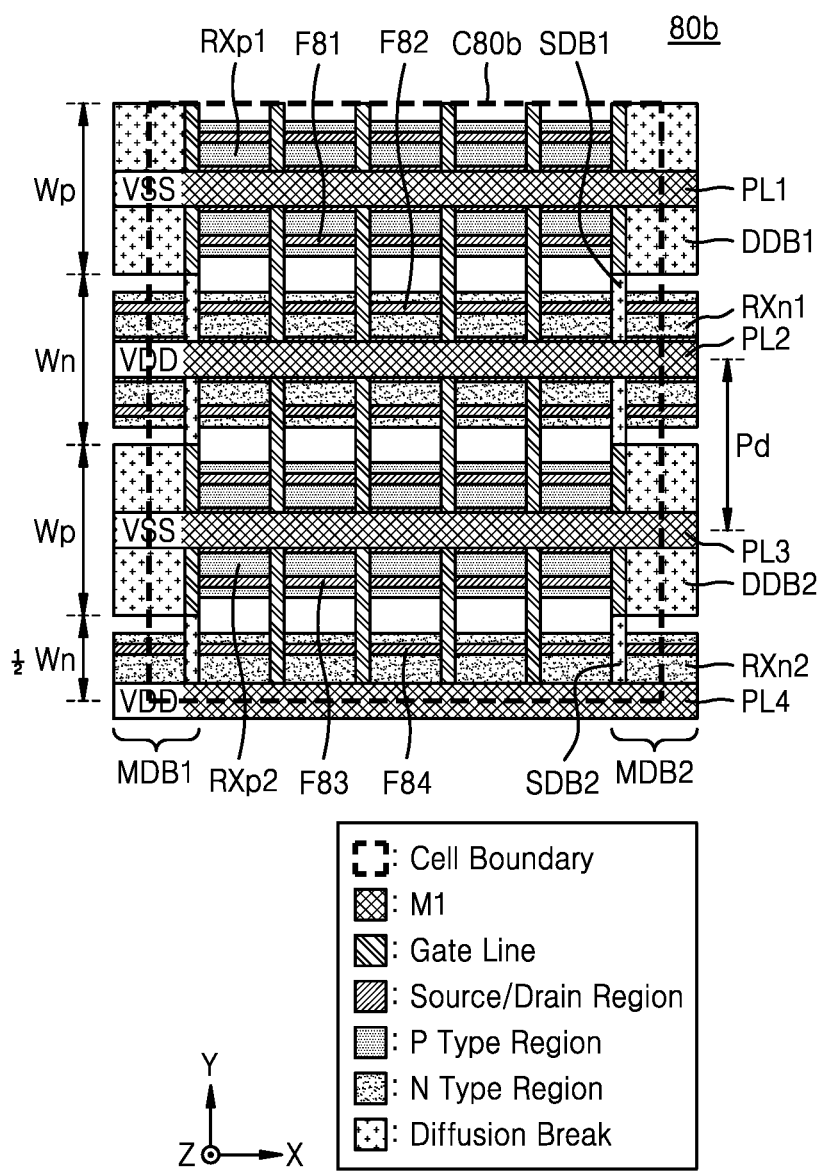

FIGS. 8A and 8B illustrate ICs according to example embodiments of the inventive concept. Particularly, FIGS. 8A and 8B are top views showing layouts of ICs 80a and 80b including standard cells C80a and C80b, respectively.

According to some embodiments, a standard cell may include a fin and/or an active region terminated by an SDB or a DDB according to a conductivity type of the active region. A DB may provide an LLE favorable to an adjacent element, e.g., a transistor, and thus a transistor closer to the DB may have better characteristics, e.g., a higher current driving capability and operating speed. In addition, transistors may have different characteristics according to types of an adjacent DB. For example, a PFET adjacent to an SDB may provide better characteristics, e.g., a higher operating current, than a PFET adjacent to a DDB. In addition, an NFET adjacent to a DDB may provide better characteristics, e.g., a higher operating current, than an NFET adjacent to an SDB. Therefore, as shown in FIGS. 8A and 8B, standard cells C80a and C80b may include N-type fins (or N-type source/drain regions) terminated by a DDB and P-type fins (or P-type source/drain regions) terminated by an SDB. This structure, in which different structural DBs are mixed and used, may be referred to as a mixed diffusion break (MDB).

Referring to FIG. 8A, the standard cell C80a may have a height corresponding to "3/2 Wn+3/2 Wp" and receive a supply voltage from the first to fourth power lines PL1, PL2, PL3, and PL4. The standard cell C80a may include five active fins extending in the X-axis direction on the first p-type active region RXp1 and the second p-type active region RXp2 and include five active fins extending in the X-axis direction on the first n-type active region RXn1 and the second n-type active region RXn2. MDBs MDB1 and MDB2 may be formed on boundaries parallel to the Y-axis direction in the standard cell C80a, and thus, the boundaries parallel to the Y-axis direction in the standard cell C80a may be located between gate lines.

The active fins extending in the X-axis direction on the first p-type active region RXp1 and the second p-type active region RXp2 may be terminated by a DDB. For example, a first fin F81 on the first p-type active region RXp1 and a third fin F83 on the second p-type active region RXp2 may be terminated by the first DDB DDB1 and the second DDB DDB2, respectively. In addition, the active fins extending in the X-axis direction on the first n-type active region RXn1 and the second n-type active region RXn2 may be terminated by an SDB. For example, a second fin F82 on the first n-type active region RXn1 and a fourth fin F84 on the second n-type active region RXn2 may be terminated by the first SDB SDB1 and a second SDB SDB2, respectively.

Referring to FIG. 8B, the standard cell C80b may have a height corresponding to "3/2 Wn+2 Wp" and receive a supply voltage from the first to fourth power lines PL1, PL2, PL3, and PL4. The standard cell C80b may include eight active fins extending in the X-axis direction on the first p-type active region RXp1 and the second p-type active region RXp2 and include five active fins extending in the X-axis direction on the first n-type active region RXn1 and the second n-type active region RXn2. The MDBs MDB1 and MDB2 may be formed on boundaries parallel to the Y-axis direction in the standard cell C80b.

The active fins extending in the X-axis direction on the first p-type active region RXp1 and the second p-type active region RXp2 may be terminated by a DDB. For example, the first fin F81 on the first p-type active region RXp1 and the third fin F83 on the second p-type active region RXp2 may be terminated by the first DDB DDB1 and the second DDB DDB2, respectively. In addition, the active fins extending in the X-axis direction on the first n-type active region RXn1 and the second n-type active region RXn2 may be terminated by an SDB. For example, the second fin F82 on the first n-type active region RXn1 and the fourth fin F84 on the second n-type active region RXn2 may be terminated by the first SDB SDB1 and the second SDB SDB2, respectively.

Figure 9:
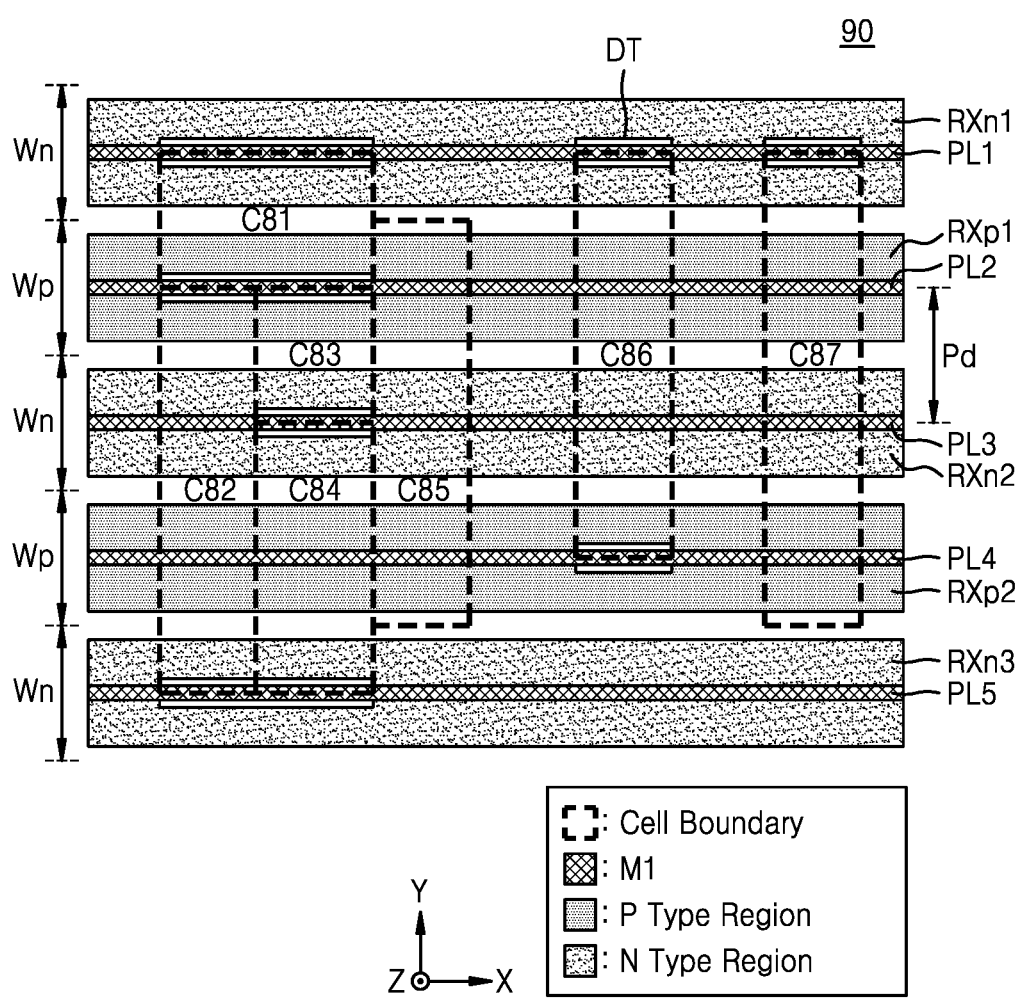
FIG. 9 illustrates an IC according to an example embodiment of the inventive concept.

FIG. 9 illustrates an IC according to an example embodiment of the inventive concept. Particularly, FIG. 9 is a top view showing a layout of an IC 90 including first to seventh standard cells C81 to C87.

The IC 90 may include first to third n-type active regions RXn1, RXn2, and RXn3 extending in the X-axis direction and first and second p-type active regions RXp1 and RXp2. In addition, the IC 90 may include first, third, and fifth power lines PL1, PL3, and PL5 which extend in the X-axis direction on the first to third n-type active regions RXn1, RXn2, and RXn3 and to which the positive supply voltage VDD is applied, and include the second and fourth power lines PL2 and PL4 which extend in the X-axis direction on the first and second p-type active regions RXp1 and RXp2 and to which the negative supply voltage VSS is applied. As described above with reference to FIG. 1A, the pitch "Pd" between the first to fifth power lines PL1 to PL5 may be "(Wn+Wp)/2".

The IC 90 may include standard cells having various heights, i.e., lengths in the Y-axis direction. For example, each of the first and third standard cells C81 and C83 may have a height corresponding to "1/2 Wn+1/2 Wp", the fourth standard cell C84 may have a height corresponding to "Wn+Wp", each of the second and sixth standard cells C82 and C86 may have a height corresponding to "3/2 Wn+3/2 Wp", the fifth standard cell C85 may have a height corresponding to "Wn+2 Wp", and the seventh standard cell C87 may have a height corresponding to "3/2 Wn+2 Wp".

According to some embodiments, a standard cell may have a boundary overlapping a center line of an active region (or a center line of a power line) or have a boundary overlapping a center line between active regions (or a boundary of a well). For example, the seventh standard cell C87 may have a boundary overlapping a center line of the first n-type active region RXn1 (or a center line of the first power line PL1) or have a boundary overlapping a center line between the second p-type active region RXp2 and the third n-type active region RXn3. As shown in FIG. 9, when a standard cell has a boundary overlapping a center line of an active region, a portion of the active region under a power line may be removed for separation from an adjacent standard cell. For example, the IC 90 may include a region DT from which a portion of the first n-type active region RXn1 is removed, near a boundary of the sixth standard cell C86 overlapping the center line of the first n-type active region RXn1.

Figure 10:
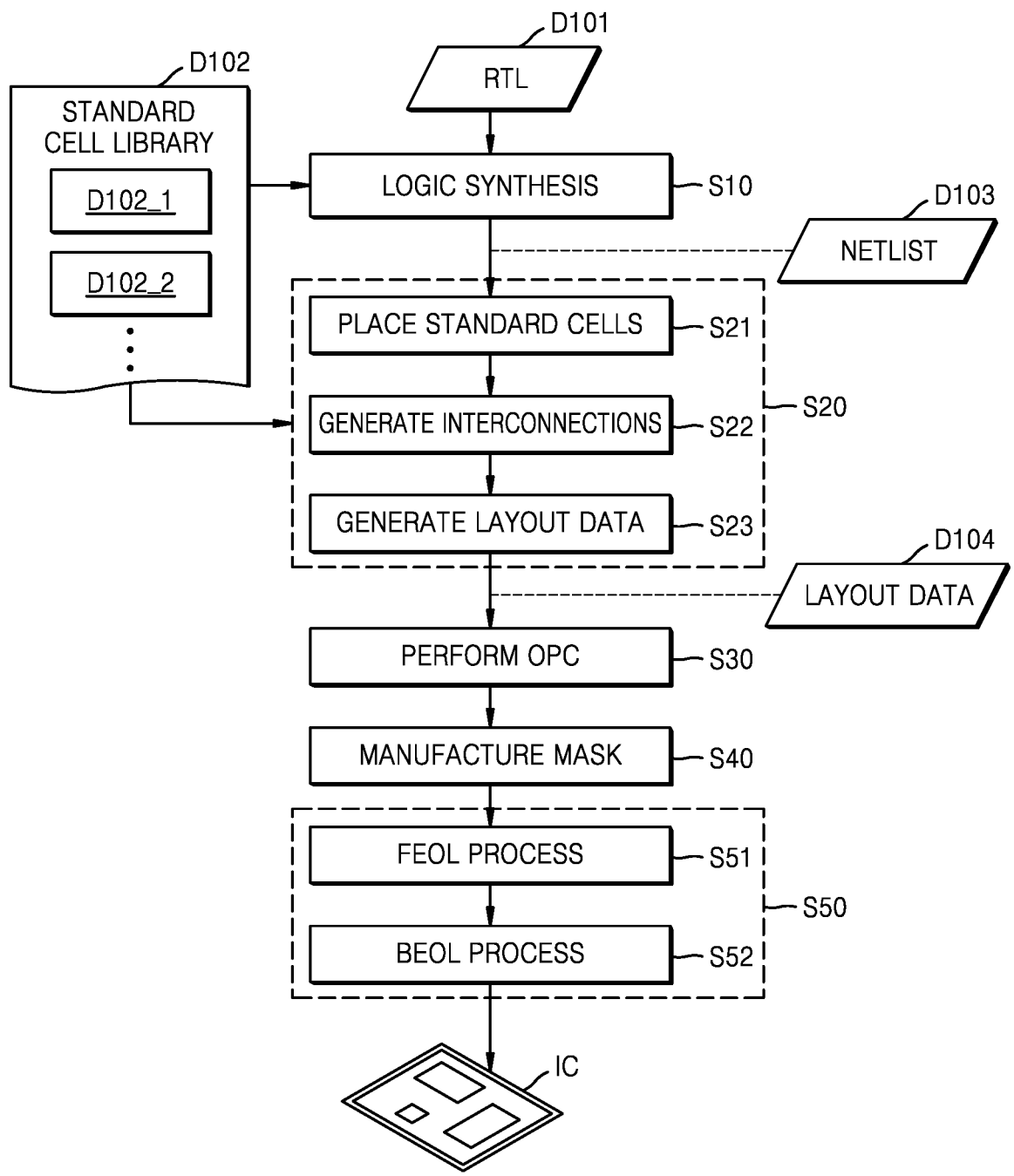
FIG. 10 is a flowchart of a method of fabricating an IC, according to an example embodiment of the inventive concept.

FIG. 10 is a flowchart of a method of fabricating an IC, according to an example embodiment of the inventive concept. Hereinafter, a description given with reference to FIGS. 1A and 1B also applies to a description with reference to FIG. 10.

A standard cell library (or cell library) D102 may include information regarding standard cells, e.g., function information, characteristic information, layout information, and the like. As shown in FIG. 10, the standard cell library D102 may include first data D102_1, second data D102_2, and the like, each defining a layout of a standard cell. According to some embodiments, for standard cells configured to provide the same function and performance, the first data D102_1 and the second data D102_2 may define mutually symmetrical structures based on an axis parallel to the X axis, respectively. As described above with reference to FIGS. 1A and 1B, the standard cells defined by the first data D102_1 and the second data D102_2 may have a height, i.e., a length in the Y-axis direction, determined by Equation 1. As described above, a layout of the standard cells defined by the first data D102_1 and the second data D102_2 may have both a simple structure and a high current driving capability.

In operation S10, a logic synthesis operation of generating netlist data D103 from register transfer level (RTL) data D101 may be performed. For example, a semiconductor design tool (e.g., a logic synthesis tool) may generate the netlist data D103 including a bitstream or a netlist by performing logic synthesis with reference to the standard cell library D102 from the RTL data D101 made using a hardware description language (HDL) such as very high-speed integrated circuit (VHSIC) HDL (VHDL) or Verilog. The standard cell library D102 may include information regarding good performance of the standard cells according to the example embodiments of the inventive concept, and standard cells may be included in an IC with reference to the information in a logic synthesis process.

In operation S20, a place & routing (P&R) operation of generating layout data D104 from the netlist data D103 may be performed. As shown in FIG. 10, the P&R operation S20 may include a plurality of operations S21, S22, and S23.

In operation S21, an operation of placing standard cells may be performed. For example, a semiconductor design tool (e.g., a P&R tool) may arrange a plurality of standard cells with reference to the standard cell library D102 from the netlist data D103. For example, the semiconductor design tool may select one of the layouts of standard cells defined by the netlist data D103 and arrange the selected layout of a standard cell, with reference to the first data D102_1 and the second data D102_2.

In operation S22, an operation of generating interconnections may be performed. The interconnection may electrically connect an output pin to an input pin of a standard cell and include, for example, at least one via and at least one conductive pattern.

In operation S23, an operation of generating layout data D104 may be performed. The layout data D104 may have a format, for example, graphic database system information interchange (GDSII) and include geometric information of interconnections of standard cells.

In operation S30, optical proximity correction (OPC) may be performed. OPC may be an operation for forming a pattern of a desired shape by correcting a distortion phenomenon such as refraction due to the characteristics of light in photolithography included in a semiconductor process for fabricating an IC, and a pattern on a mask may be determined by applying OPC to the layout data D104. According to some embodiments, a layout of an IC may be restrictively changed in operation S30, and the restrictive change of the IC in operation S30 may be referred to as design polishing as post-processing for optimizing a structure of the IC.

In operation S40, an operation of manufacturing a mask may be performed. For example, patterns of a mask may be defined to form patterns on a plurality of layers by applying OPC to the layout data D104, or at least one mask (or photomask) for forming patterns of each of the plurality of layers may be manufactured.

In operation S50, an operation of fabricating an IC may be performed. For example, an IC may be fabricated by patterning a plurality of layers using the at least one mask manufactured in operation S40. As shown in FIG. 10, operation S50 may include operations S51 and S52.

In operation S51, a front-end-of-line (FEOL) process may be performed. The FEOL (or FEOL process) may be a process of forming individual elements, e.g., a transistor, a capacitor, a resistor, and the like, on a substrate in a process of fabricating an IC. For example, the FEOL may include planarizing and cleaning a wafer, forming a trench, forming a well, forming a gate line, forming a source and a drain, and the like.

In operation S52, a back-end-of-line (BEOL) process may be performed. The BEOL (or BEOL process) may be a process of interconnecting individual elements, e.g., a transistor, a capacitor, a resistor, and the like, in a process of fabricating an IC. For example, the BEOL may include siliciding gate, source, and drain regions, adding a dielectric, planarizing, forming a hole, adding a metal layer, forming a via, forming a passivation layer, and the like. Thereafter, the IC may be packaged in a semiconductor package and used as a component for various applications.

Figure 11:
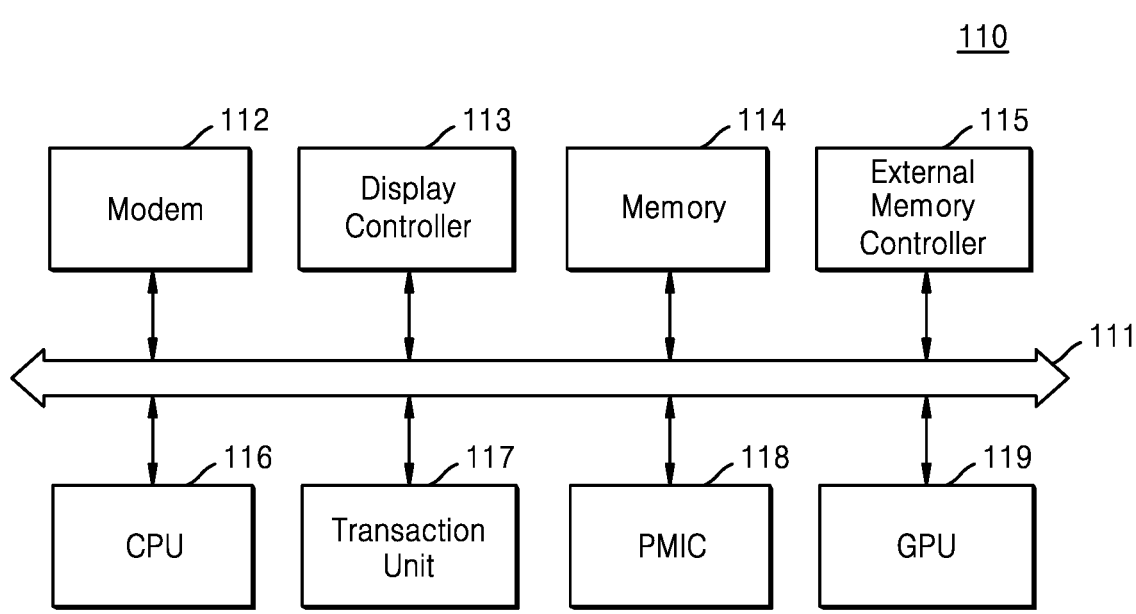
FIG. 11 is a block diagram of a system on chip (SoC) according to an example embodiment of the inventive concept.

FIG. 11 is a block diagram of a system on chip (SoC) 110 according to an example embodiment of the inventive concept. The SoC 110 is a semiconductor device and may include an IC according to an example embodiment of the inventive concept. The SoC 110 is a single chip in which complex functional blocks such as intellectual properties configured to perform various functions are implemented, and standard cells according to example embodiments of the inventive concept may be included in respective functional blocks in the SoC 110, and thus, the SoC 110 configured to provide improved performance and operation reliability may be achieved.

Referring to FIG. 11, the SoC 110 may include a modem 112, a display controller 113, a memory 114, an external memory controller 115, a central processing unit (CPU) 116, a transaction unit 117, a power management integrated circuit (PMIC) 118, and a graphics processing unit (GPU) 119, and the functional blocks in the SoC 110 may communicate with each other through a system bus 111.

The CPU 116 capable of generally controlling an operation of the SoC 110 may control operations of the other functional blocks, that is, the modem 112, the display controller 113, the memory 114, the external memory controller 115, the transaction unit 117, the PMIC 118, and the GPU 119. The modem 112 may demodulate a signal received from the outside, or modulate a signal generated inside the SoC 110 and transmit the modulated signal to the outside. The external memory controller 115 may control an operation of transmitting and receiving data to and from an external memory device connected to the SoC 110. For example, a program and/or data stored in the external memory device may be provided to the CPU 116 or the GPU 119 under control of the external memory controller 115. The GPU 119 may execute program instructions related to graphics processing. The GPU 119 may receive graphics data through the external memory controller 115 and may transmit graphics data processed by the GPU 119 to the outside of the SoC 110 through the external memory controller 115. The transaction unit 117 may monitor data transactions of respective functional blocks, and the PMIC 118 may control power to be supplied to each functional block, under control of the transaction unit 117. The display controller 113 may control a display (or display device) outside the SoC 110 to transmit data generated inside the SoC 110 to the display.

The memory 114 may include, as a nonvolatile memory, electrically erasable programmable read-only memory (EE-PROM), flash memory, phase change random access memory (PRAM), resistance random access memory (RRAM), nano floating gate memory (NFGM), polymer random access memory (PoRAM), magnetic random access memory (MRAM), ferroelectric random access memory (FRAM), and the like and include, as a volatile memory, dynamic random access memory (DRAM), static random access memory (SRAM), mobile DRAM, double data rate synchronous dynamic random access memory (DDR SDRAM), low power DDR (LPDDR) SDRAM, Graphic DDR (GDDR) SDRAM, Rambus dynamic random access memory (RDRAM), and the like.

Figure 12:
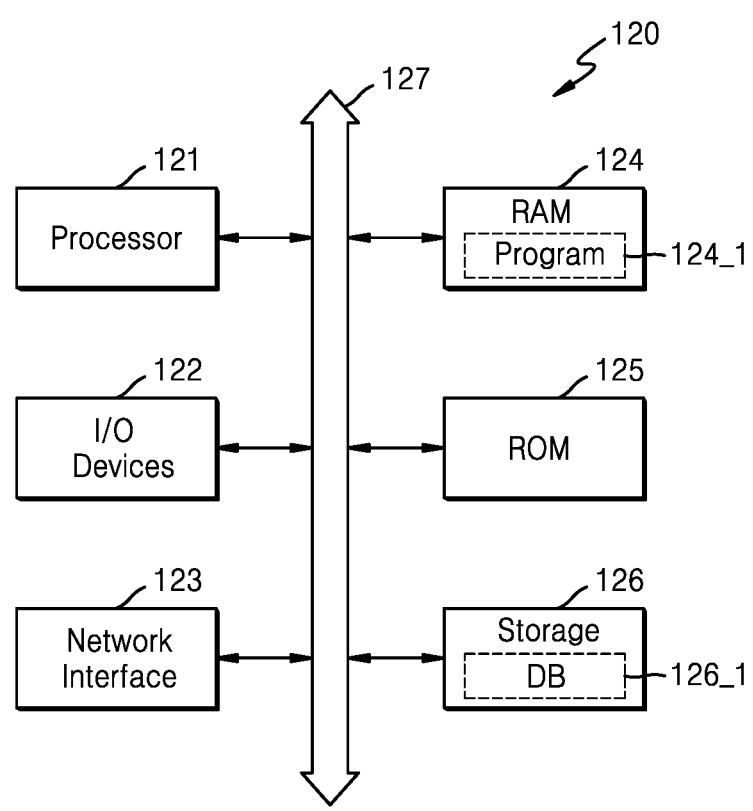
FIG. 12 is a block diagram of a computing system including a memory configured to store a program, according to an example embodiment of the inventive concept.

FIG. 12 is a block diagram of a computing system 120 including a memory configured to store a program, according to an example embodiment of the inventive concept. At least some of operations of a method (e.g., the method in FIG. 10) of fabricating an IC according to example embodiments of the inventive concept may be performed in the computing system 120.

The computing system 120 may be a stationary computing system such as a desktop computer, a workstation, or a server or a portable computing system such as a laptop computer. As shown in FIG. 12, the computing system 120 may include a processor 121, input/output (I/O) devices 122, a network interface 123, RAM 124, ROM 125, and a storage 126. The processor 121, the I/O devices 122, the network interface 123, the RAM 124, the ROM 125, and the storage 126 may be connected to a bus 127 and communicate with each other through the bus 127.

The processor 121 may be referred to as a processing unit and may include at least one core, such as a microprocessor, an application processor (AP), a digital signal processor (DSP), and a GPU, capable of executing a random instruction set (e.g., Intel architecture (IA)-32, 64-bit extension IA-32, x86-64, Power PC, Sparc, millions of instructions per second (MIPS), advanced reduced instruction set computer (RISC) machine (ARM), IA-64, or the like). For example, the processor 121 may access a memory, i.e., the RAM 124 or the ROM 125, through the bus 127 and execute instructions stored in the RAM 124 or the ROM 125.

The RAM 124 may store a program 124_1 configured to fabricate an IC according to an example embodiment of the inventive concept or at least a portion of the program 124_1, and the program 124_1 may instruct the processor 121 to execute at least some of operations of a method of fabricating an IC (e.g., the method in FIG. 10). That is, the program 124_1 may include a plurality of instructions executable by the processor 121, and the plurality of instructions included in the program 124_1 may be used for the processor 121 to execute at least some of the operations of the flowchart described above with reference to FIG. 10.

The storage 126 may not lose data stored therein even though power supplied to the computing system 120 is blocked. For example, the storage 126 may include a non-volatile memory device or include a storage medium such as a magnetic tape, an optical disc, or a magnetic disc. In addition, the storage 126 may be attachable to or detachable from the computing system 120. The storage 126 may store the program 124_1 according to an example embodiment of the inventive concept, and before the program 124_1 is executed by the processor 121, the program 124_1 or at least a portion thereof may be loaded from the storage 126 to the RAM 124. Alternatively, the storage 126 may store a file made using a programming language, and the program 124_1 generated by a compiler or the like from the file or at least a portion thereof may be loaded to the RAM 124. In addition, as shown in FIG. 12, the storage 126 may store a database (DB) 126_1, and the DB 126_1 may include information required to design an IC, e.g., the standard cell library D102 in FIG. 10.

The storage 126 may store data to be processed by the processor 121 or data processed by the processor 121. That is, the processor 121 may generate data by processing data stored in the storage 126 according to the program 124_1 and store the generated data in the storage 126. For example, the storage 126 may store the RTL data D101, the netlist data D103, and/or the layout data D104 in FIG. 10.

The I/O devices 122 may include input devices such as a keyboard and a pointing device and output devices such as a display device and a printer. For example, a user may trigger the execution of the program 124_1 by the processor 121, input the RTL data D101 and/or the netlist data D103 in FIG. 10, and check the layout data D104 in FIG. 10, through the I/O devices 122.

The network interface 123 may provide an access to a network outside the computing system 120. For example, the network may include a plurality of computing systems and communication links, and the communication links may include wired links, optical links, wireless links, or other types of random links.

While the inventive concept has been particularly shown and described with reference to embodiments thereof, it will be understood that various changes in form and details may be made therein without departing from the spirit and scope of the following claims.

What is claimed is:

1. An integrated circuit comprising a standard cell, the integrated circuit comprising:
   a plurality of first wells extending in a first horizontal direction, the plurality of first wells having a first width and a first conductivity type; and
   a plurality of second wells extending in the first horizontal direction, the plurality of second wells having a second width and a second conductivity type, wherein the plurality of first wells and the plurality of second wells are alternately arranged in a second horizontal direction that is orthogonal to the first horizontal direction, and wherein the standard cell has a length in the second horizontal direction, the length being equal to a sum of m times a half of the first width and n times a half of the second width, wherein m and n are integers equal to or greater than 3.

2. The integrated circuit of claim 1, wherein a boundary of the standard cell, which is parallel to the first horizontal direction, overlaps a boundary between a first well and a second well or overlaps a center line of a first well or a second well, which extends in the first horizontal direction.

3. The integrated circuit of claim 1, further comprising:
a plurality of first power lines extending in the first horizontal direction on the plurality of first wells, the plurality of first power lines being configured such that a first supply voltage is applied thereto; and
a plurality of second power lines extending in the first horizontal direction on the plurality of second wells, the plurality of second power lines being configured such that a second supply voltage is applied thereto.

4. The integrated circuit of claim 3, wherein the standard cell is configured to receive the first supply voltage from at least two first power lines or receive the second supply voltage from at least two second power lines.

5. The integrated circuit of claim 1, wherein the standard cell comprises:
a plurality of first fins extending in the first horizontal direction on two or more first wells; and
a first gate line extending in the second horizontal direction, the first gate line forming transistors with the plurality of first fins.

6. The integrated circuit of claim 5, wherein the standard cell further comprises:
a plurality of second fins extending in the first horizontal direction on two or more second wells; and
a second gate line extending in the second horizontal direction, the second gate line forming transistors with the plurality of second fins.

7. The integrated circuit of claim 1, wherein the standard cell further comprises:
at least one first fin extending in the first horizontal direction on a first well; and
at least one second fin extending in the first horizontal direction on a second well, and
the at least one first fin and the at least one second fin are terminated by a diffusion break on a boundary of the standard cell.

8. The integrated circuit of claim 7, wherein the first conductivity type is n-type and the second conductivity type is p-type,
the at least one first fin is terminated by a single diffusion break (SDB), and
the at least one second fin is terminated by a double diffusion break (DDB).

9. The integrated circuit of claim 1, wherein the standard cell further comprises:
a plurality of first fins extending in the first horizontal direction on at least one first well; and
a plurality of second fins extending in the first horizontal direction on at least one second well, and
the number of the plurality of first fins differs from the number of the plurality of second fins.

10. The integrated circuit of claim 1, wherein the first width is the same as the second width.

* * * * *